(12) United States Patent
An et al.

(10) Patent No.: US 6,686,620 B2
(45) Date of Patent: Feb. 3, 2004

(54) FRAM AND METHOD OF FABRICATING THE SAME

(75) Inventors: Hyeong-Geun An, Kyunggi-do (KR); Soon-Oh Park, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 26 days.

(21) Appl. No.: 10/109,432

(22) Filed: Mar. 27, 2002

(65) Prior Publication Data

US 2002/0153550 A1 Oct. 24, 2002

(30) Foreign Application Priority Data

Apr. 18, 2001 (KR) .......................................... 2001-20766

(51) Int. Cl.$^7$ ............................................. H01L 27/108
(52) U.S. Cl. ................... 257/301; 257/288; 257/295; 257/296; 257/302; 257/313; 438/3; 438/243; 438/386
(58) Field of Search ................... 257/288, 295, 257/296, 301, 302, 303; 438/3, 243, 386

(56) References Cited

U.S. PATENT DOCUMENTS

| | | | | |
|---|---|---|---|---|
| 5,618,746 A | * | 4/1997 | Hwang | ..................... 438/3 |
| 5,774,327 A | * | 6/1998 | Park | ..................... 361/321.5 |
| 5,798,903 A | * | 8/1998 | Dhote et al. | ............. 361/321.4 |
| 6,075,264 A | * | 6/2000 | Koo | ............................. 257/295 |
| 6,201,271 B1 | * | 3/2001 | Okutoh et al. | ............... 257/295 |
| 6,297,527 B1 | * | 10/2001 | Agarwal et al. | ............. 257/306 |

* cited by examiner

Primary Examiner—George Eckert
Assistant Examiner—Edgardo Ortiz
(74) Attorney, Agent, or Firm—Marger Johnson & McCollom, P.C.

(57) ABSTRACT

A FRAM having a ferroelectric capacitor comprises a cylindrical type bottom electrode. A ferroelectric film is thinly stacked over the bottom electrode, and the first portion of the top electrode formed over and conformal to the ferroelectric film. A void that is left between sidewalls of the first portion of the electrode over the ferroelectric film is then filled with fill material for a fill layer. The fill material of the fill layer is then planarized to be level with and expose an upper surface of the first portion of the top electrode. A second portion of the top electrode is then formed over the fill layer and in contact with the exposed, e.g. peripheral regions of the first portion of the electrode. The fill material of the fill layer may be formed of polysilicon, silicon oxide or other material such as another metal. Additionally, the fill layer may be formed of a fill material that has a superior gap fill capability or of a material that has a low stress relationship with respect to the capacitor's top metal.

11 Claims, 9 Drawing Sheets

FRAM AND METHOD OF FABRICATING THE SAME

RELATED APPLICATION

This application claims benefit and priority of Korean Patent Application No. 2001-20766, filed on Apr. 18, 2001, the contents of which are herein incorporated by reference in its entirety.

FIELD OF THE INVENTION

The present invention relates to a ferroelectric random access memory (FRAM) and to a method of fabricating the same, and more particularly the present invention relates to a capacitor structure of the FRAM device and to its method of fabrication.

BACKGROUND OF THE INVENTION

A ferroelectric random access memory (FRAM) employs a ferroelectric material that has a spontaneous polarization phenomenon. The ferroelectric material has a characteristic in which a polarization (remnant polarization), of the material will remain after removing an external electric field. Additionally, the direction of the polarization can be changed by changing a direction of the external electric field. Exemplary known ferroelectric material include PZT ($Pb(Zr,Ti)O_3$) and SBT ($SrBi_2Ta_2O_9$).

FRAMs can be classified into separate categories in accordance with their structural elements. One of them uses a transistor that has a ferroelectric for its gate insulation layer. The other comprises unit cells, each of which has an access transistor and a capacitor having a ferroelectric dielectric.

The former type of FRAM has two problems. The first problem is that in the process of fabricating the type of FRAM, oxygen atoms in the ferroelectric film of the ferroelectric film might react with silicon of the substitute to form a silicon oxide layer between the substrate (over the transistor's channel region) and the ferroelectric film of the gate insulation layer. The second problem concerns a difficulty in forming a high-quality ferroelectric film, which is affected by differences between the lattice constant or thermal expansion coefficient of the silicon substrate relative to the ferroelectric film.

The latter FRAM type may be viewed simplistically as having the same structure as a DRAM cell with the exception of using a ferroelectric film for the dielectric layer of the cell capacitor.

FRAMs have fast read/write operation in comparison with other nonvolatile memory such as EPROM or EEPROM. Additionally, they can carry read/write operations with a single power supply voltage like a DRAM. Thus, the FRAM can have a simple structure that may be related to a peripheral circuit.

The FRAM has another difference from the DRAM, it uses the residual polarization condition of a ferroelectric film for its storage mechanism in contrast to stored charge across the capacitor plates. Therefore, the FRAM doesn't need to perform refresh operations to restore charge as do the DRAMS. Because of these differences, the FRAM may consume less power and offer improved response time.

For a conventional DRAM, a bottom storage electrode is formed with various features in order to enhance the capacitor's capacitance. Unlike the capacitors of DRAM devices, the capacitors of FRAMs typically use flat-plate electrodes 36 and 32 as shown in FIG. 4. Flat plates have been used for FRAMs because the capacitance is easy to secure since the ferroelectric film 34 is used even though the cell capacitor is not three-dimensionally formed. Additionally, the flat-plate structure is more easily formed given the material characteristic of the ferroelectric capacitor.

But, as FRAMs become more highly integrated, it may be difficult to secure sufficient capacitance with a capacitor of a conventional flat-plate electrode. Thus, even the FRAM manufacturers are beginning to make bottom electrodes with cylindrical shapes in order to improve the ferroelectric surface area in a limited area of the more highly integrated devices.

FIGS. 1 through 3 are cross-sectional views to illustrate a problem of a conventional FRAM having a cylinder type capacitor.

Referring to FIGS. 1 through 3, the FRAM needs a contact plug 41 to connect the capacitor's top electrode 36 with a capacitor plate line 50. But, in the event that the capacitor's bottom electrode 32 is formed with the cylinder shape, the top electrode 36 may have a step difference. The step difference may become problematic when trying to form contact plug 41 connected to top electrode 36. That is, if the contact plug 41 is formed at a hollow position of the top electrode, as shown in FIG. 1, it may be difficult to form a contact hole given the required aspect ratio. Also, in the event a peripheral part 39 is formed and the contact plug 41 is connected to a high step of the capacitor top electrode 36, as shown in FIG. 2, there may be a problem as formation area changes. Further, the contact hole 43 may be formed with an incorrect alignment, as shown in FIG. 3, and the contact hole 43 may have to extend between the high step and the low step. Thus, it is difficult to form the contact hole 36 with a perfect depth for both the low step and the high step for the high step might be easily etch-damaged.

SUMMARY OF THE INVENTION

In accordance with exemplary embodiments, a FRAM comprises a top electrode that can be reliably connected to a capacitor plate line.

A FRAM in accordance with an exemplary embodiment of the present invention comprises a cylindrical type bottom electrode, a ferroelectric film thinly formed thereon, and a top electrode. A peripheral part of the ferroelectric film covers a cylindrical top of the capacitor's bottom electrode. In an optional exemplary embodiment, the peripheral part is contiguous with that of a neighboring device, i.e. one continuous dielectric layer for multiple cells. The capacitor's top electrode includes a first portion, a fill layer, and a second portion. The first portion of the top electrode includes a liner part; the top electrode may also include a peripheral part. The two portions contact the top surface of the ferroelectric film. The liner part for the top electrode is conformal to the ferroelectric, and will have substantially the same shape as a liner part of the ferroelectric film. A hallow define between the walls of the electrode's liner part is filled with fill material to establish a fill layer. The fill material of the fill layer may be formed of polysilicon, silicon oxide or another material such as another metal. In one embodiment, the fill layer may comprise a fill material having a superior gap-fill capability or low stress relationship with respect to the material of the top electrode (which may comprise a metal or other conductive material). The top surface of the fill material of the fill layer and the peripheral part of the electrode are covered with the second portion to the top electrode.

The ferroelectric material may comprise one of PZT($Pb(Zr,Ti)O3$) and SBT($SrBi2Ta2O9$). These may be formed using chemical vapor deposition(CVD) technique instead of a coating technique that uses a sol gel change.

In a particular embodiment, the first and second portions of the top electrode may comprise the same material. For example, they may comprise a metal that is not easily oxidized at a high temperature or a metal that remains conductive in its oxidized state. Such metal may comprise platinum, ruthenium, iridium, rhodium, osmium or palladium.

In accordance with another exemplary embodiment, a method of forming a memory comprises forming an insulation layer over a substrate. The insulation layer is patterned to form a hole that exposes a region of the substrate. A bottom electrode material is formed conformal to the substrate and sidewalls that define the hole. A ferroelectric material is conformally formed over the bottom electrode. A first portion of a top electrode material layer is then formed conformal to and over the ferroelectric material. A hollow that is defined by where the first portion of the top electrode drops into the capacitor hole, such hollow is filled with fill material to establish a fill layer. A second portion of top electrode material is then formed over the material of the fill layer and a peripheral part of the first portion of the top electrode.

In one embodiment, after forming a layer of material for the bottom electrode, chemical-mechanical polishing (CMP) may be performed until exposing a region of the insulation layer outside the outline of the hole.

In a further embodiment, the fill layer is formed to a thickness sufficient to fill the hollow (i.e., within a cylindrical shape defined by walls to the first portion of the top electrode). The fill material or fill layer may then be planarization-etched, e.g., using anisotropic etching or chemical-mechanical polishing (CMP).

In another embodiment, a protection layer may be formed over the ferroelectric film and the fill material of the fill layer may comprise silicon oxide. In this embodiment, the protective layer may comprise a hydrogen barrier and can be formed to prevent the ferroelectric film from being affected by hydrogen that may be generated during the process of filling the hollow with the fill material to establish the fill layer. Subsequently portions of the protection layer might then be removed together with some of the fill material of the fill layer during its planarization-etching.

In order to prevent oxidation of a conductivity region of the substrate, in accordance with a further embodiment, an oxidation barrier layer is also to be formed over the substrate after the hole has been formed in the insulation layer, and before forming the bottom electrode.

DESCRIPTION OF THE PREFERRED EMBODIMENT

The present invention will now be described more fully hereinafter with reference to the accompanying drawings, in which exemplary embodiments of the invention are shown. This invention may, however, be embodied in different forms and should not be construed as limited to the specific embodiments set forth herein. Rather, these embodiments are provided so that this disclosure will be thorough and complete, and will convey the scope of the invention to those skilled in the art.

Figure 1:
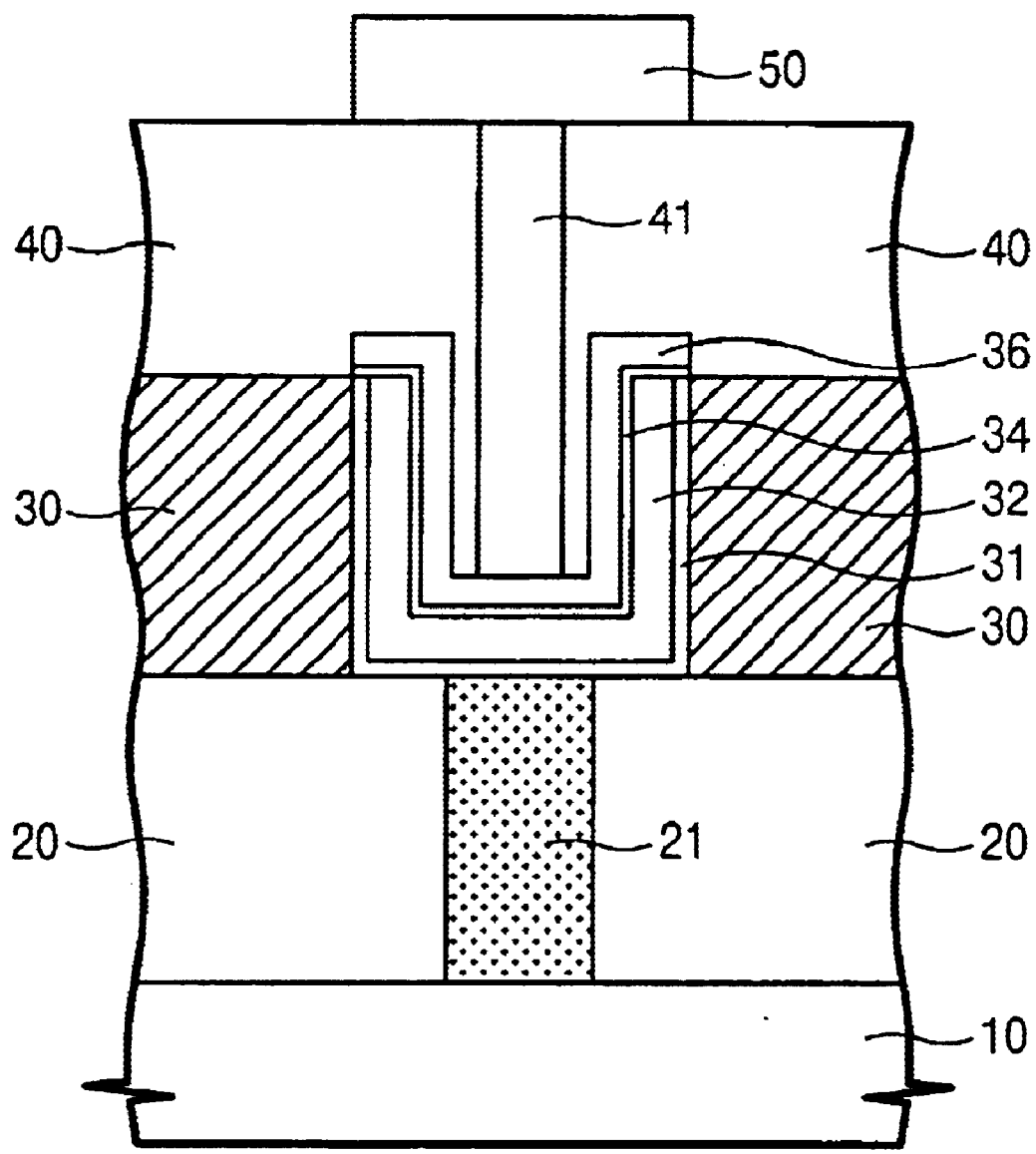
FIGS. 1 through 3 are cross-sectional views to illustrate conventional FRAMs that have a capacitor of a cylindrical shape.
Figure 2:
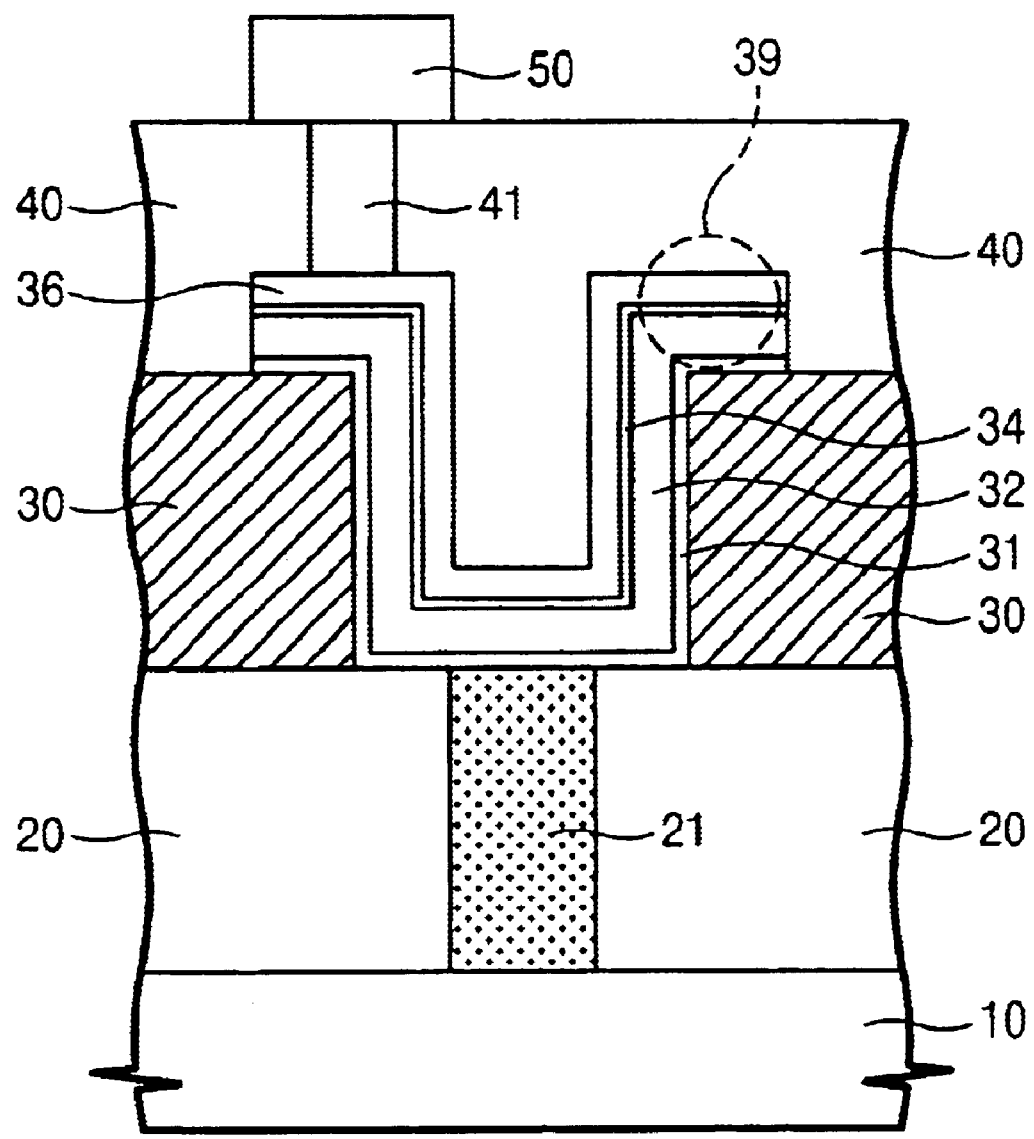
Figure 3:
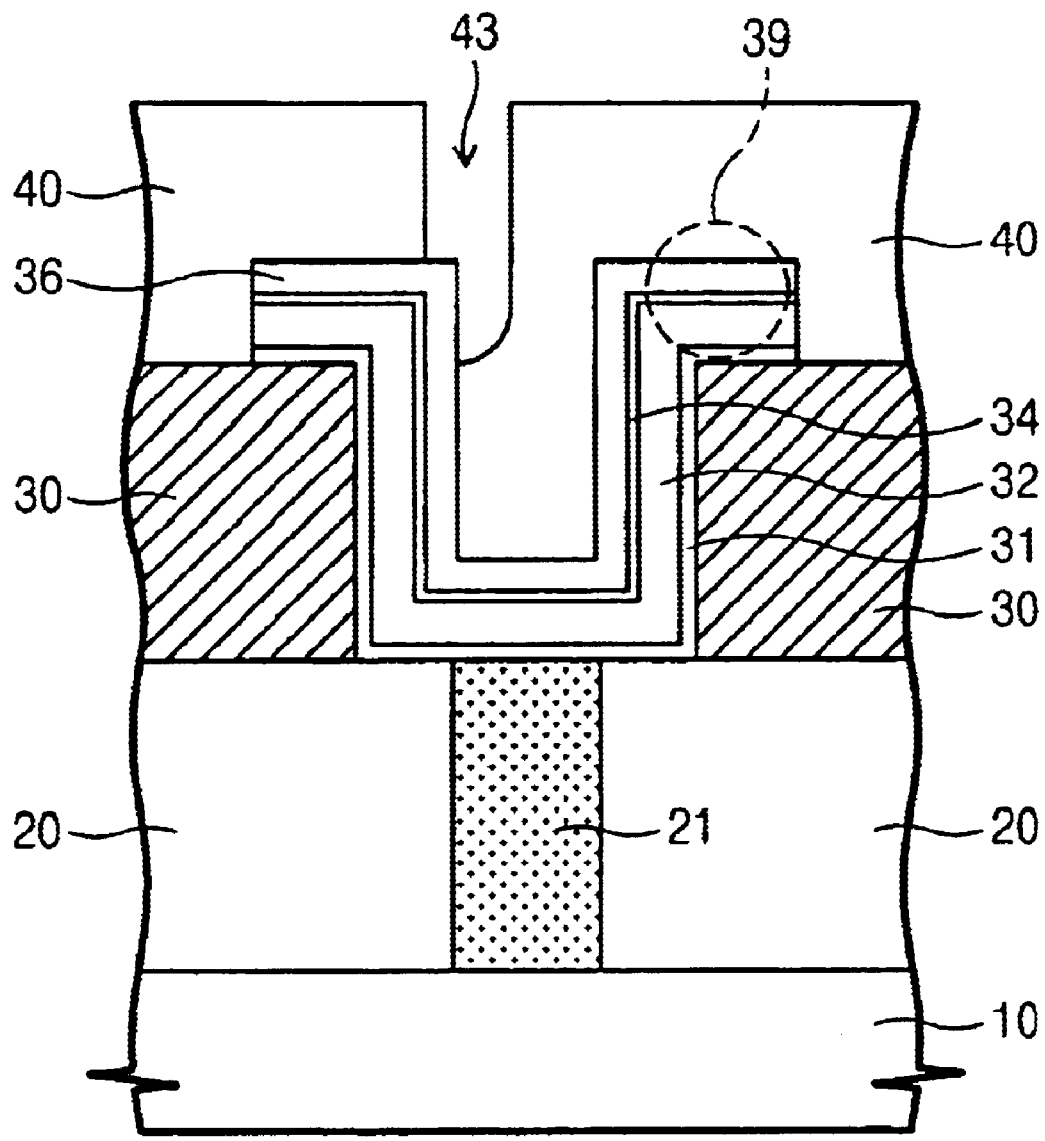
Figure 4:
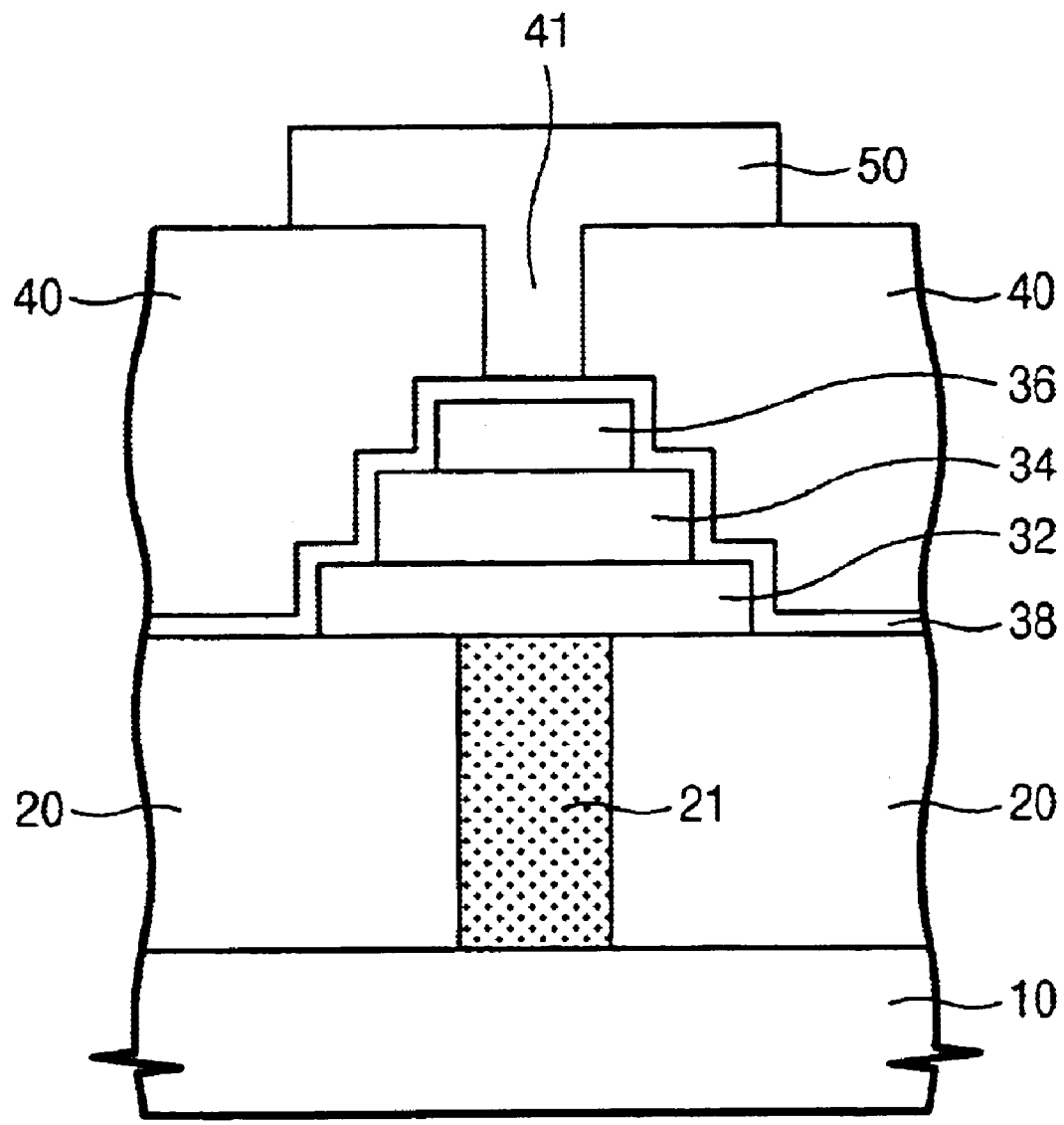
FIGS. 4 is a cross-sectional view to illustrate a feature of a conventional flat-plate FRAM.
Figure 5:
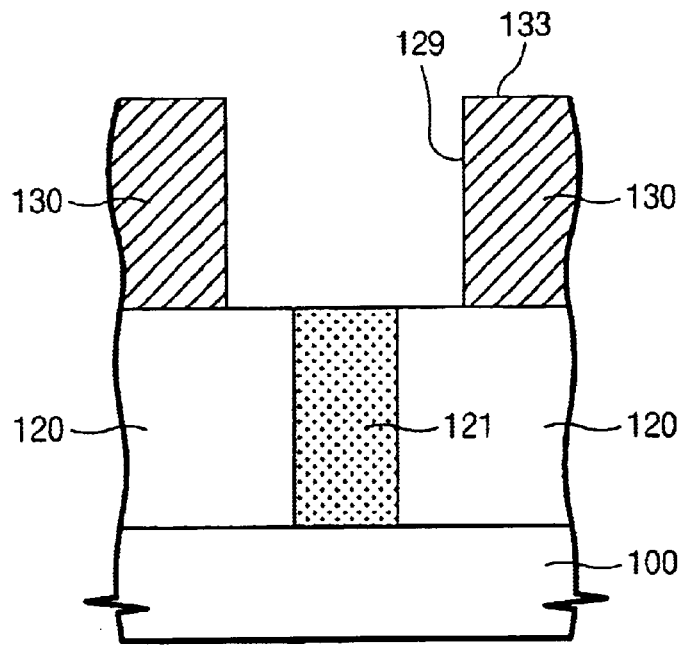
FIGS. 5 through 11 are cross-sectional views to illustrate various conditions during formation of a FRAM in accordance with exemplary embodiments of the present invention.

Referring to FIG. 5, in accordance with an exemplary embodiment of the present invention, an insulation layer 120 is formed on substrate 100, and contact plug 121 formed through insulation layer 120 over conductive region. In this embodiment, substrate 100 may have a MOSFET structure and a bit line (not shown). The MOSFET structure has a gate and source/drain regions, and the bit line would be connected to the drain region through a contact.

Further referencing FIG. 5, contact plug 121 that pierces through the insulation layer 120 may be known as a storage node contact plug and may be electrically connected with a source region of the substrate either directly or through an extra pad. Another insulation layer 130 is formed on insulation layer 120 and is patterned with a hole for the capacitor formation. Insulation layer 120 and/or insulation layer 130 may be formed of silicon oxide. In this embodiment, contact plug 121 may be formed of impurity-doped polysilicon.

Figure 6:
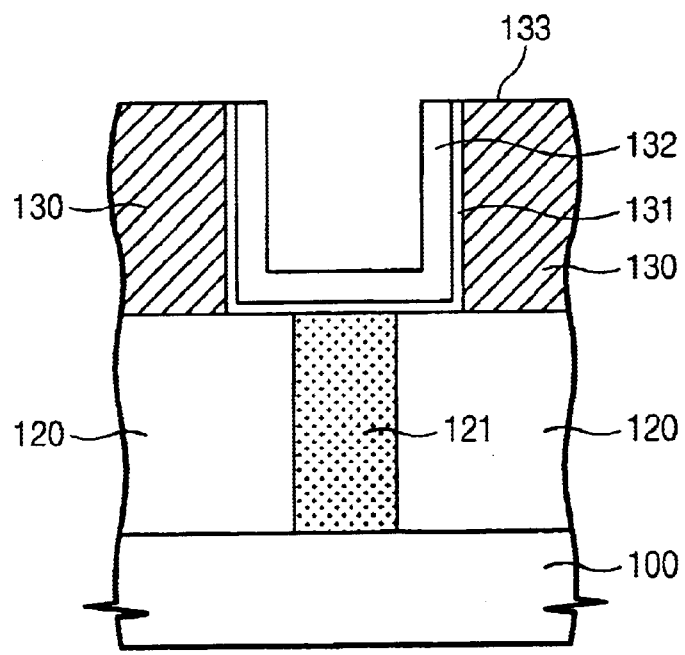

Referring to FIG. 6, a barrier metal layer 131 and bottom electrode layer 132 are conformally stacked on insulation layer 130, including sidewalls thereof that define the capacitor hole, and also on exposed regions of lower insulating layer 120 and plug 121. The barrier metal is formed in order to prevent oxygen from diffusing through the bottom electrode and into the plug where it might otherwise oxidize the contact plug during subsequent annealing processes. Such oxidation would be undesirable. Should the contact plug oxidize, an electrical resistance would increase at its interface to the bottom electrode, which, in turn, would degrade the capacitor's efficiency or make its operation impossible.

As used herein, a layer that is formed on walls 129 (FIG. 5) of the insulation layer that define the capacitor hole may be termed a "liner part". Additionally, such liner may also comprise a portion over a bottom floor or wall of the cylindrical shape associated with the capacitor hole. Additionally, when a layer extends outside of the hole, beyond its lip or over an upper surface 133 of insulating layer 130, such overlapping portion of the layer may be described as a peripheral part or as a flange portion of such layer. For example, a first layer of the upper electrode may comprise a flange portion that extends radially outward beyond a lip of the hole. Such flange portion might likewise be over a flange or peripheral portion of the ferroelectric layer.

Various materials such as metal, metal silicide or metal nitride may be used as the barrier metal. For example, at least one of titanium, titanium nitride, aluminum nitride, titanium silicide or aluminum silicide can be used. Further, the barrier metal may be a conductive oxide of a metal such as platinum, ruthenium, iridium, rhodium, osmium and palladium. It is understood that the method of forming the barrier metal layer may change in accordance with the kind of a metal. Typically, the method may comprise one of sputtering, chemical vapor deposition (CVD) and atomic layer deposition (ALD).

For the material of the capacitor's bottom electrode, it typically may comprise either a metal that is not easily oxidized by temperatures in subsequent steps of forming the ferroelectric film, or a metal material that is conductive in its oxidized state. For example, it may comprise a precious metal such as platinum, ruthenium, iridium, rhodium, osmium, and palladium.

Next, in order to separate the individual capacitors, a device isolation process is performed and may comprise CMP planarization. Material of the layer for the bottom electrode is planarized until exposing the top surface of the assistant insulation layer 130. By such exemplary process, the area of the capacitor's bottom electrode 132 and barrier metal 131 are defined by the inside of the walls that define the capacitor hole.

Figure 7:
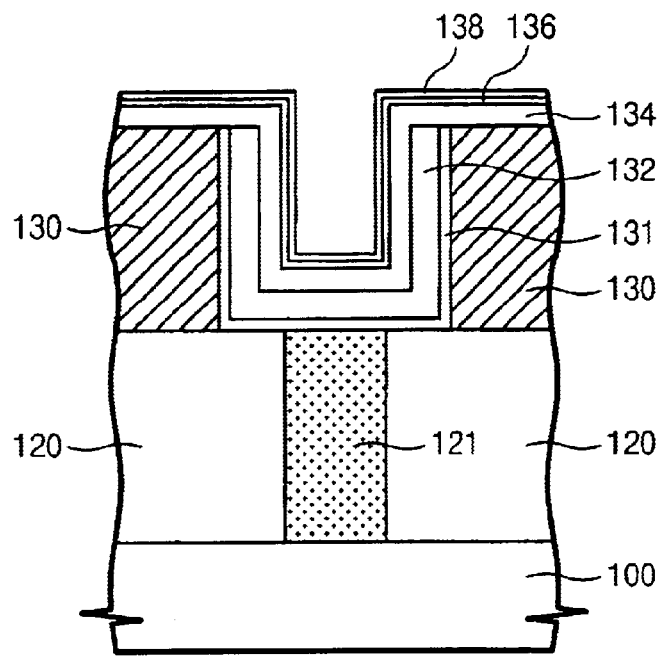

Referring to FIG. 7, a ferroelectric film 134 of a ferroelectric material is formed on the substrate and conformal to the capacitor's bottom electrode 132. The ferroelectric material, may comprise one of $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$, and $Bi_4Ti_3O_{12}$, and may be formed by one of sputtering, CVD, ALD besides the coating technique using the sol-gel change. After stacking the material for ferroelectric film 134, generally, a polycrystalline ferroelectric process may take it to a temperature of 500 to 800° C. under the oxidation ambient. Next, the capacitor's first layer 136 of the top electrode is conformally formed over the ferroelectric. The first layer 136 of the top electrode may be formed with a precious metal the same as the bottom electrode 132. In this embodiment, before forming a silicon oxide layer, a protection layer 138 may be stacked on the first layer 136 of the top electrode. The protection layer will serve to prevent degradation of the ferroelectric film 134. More specifically, in this exemplary embodiment, the protection layer 138 may function as a hydrogen barrier. Protection layer 138 may comprise one of aluminum oxide, titanium oxide, zirconium oxide, and cesium oxide. The protection layer 138 might also function to serve as a stopper layer during subsequent CMP processing of fill material of a fill layer, and may protect the first top electrode from the CMP elements.

Figure 8:
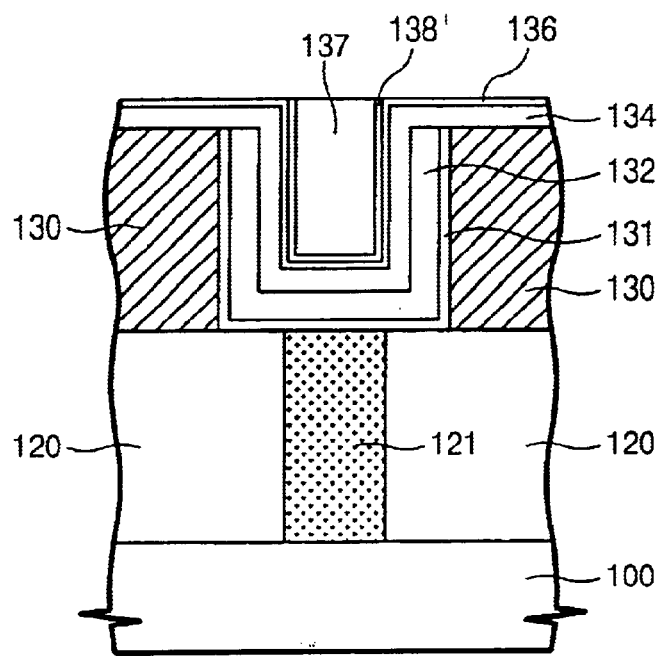

Referring to FIG. 8, silicon oxide may be used to fill a hollow of the capacitor hole defined by inwardly facing walls of the electrode layer 136. In order to fill the hollow with the silicon oxide, first, the silicon oxide layer is stacked on the entire surface of the structure of FIG. 7. After obtaining a thickness for the silicon oxide layer sufficient to fill the hollow, CMP or anisotropic etching may be performed to expose the outer peripheral surface of the first layer 136 of the top electrode. However, in the event that the silicon oxide is stacked by CVD, silane(SiH4) gas may be used as a source gas. Thus, hydrogen may be generated during the process of CVD stacking of the silicon oxide layer. The released hydrogen can have the effect of reducing a part of ferroelectric film 134 should it pass through the thin layer for the first portion 136 of the top electrode. During subsequent planarization-etching to remove regions of the silicon oxide over the first electrode layer, the protection layer may also be removed. Remaining portions 138',137, of the protection layer and the fill layer respectively stay within the capacitor hole.

In highly integrated memory devices, the height of sidewalls of a capacitor hole may increase to a high aspect ratio. Thus, the formations of fill layer 137 may use fill material of polysilicon, CVD tungsten or a coating layer of spin on glass (SOG) per techniques having a superior gap fill capability.

Figure 9:
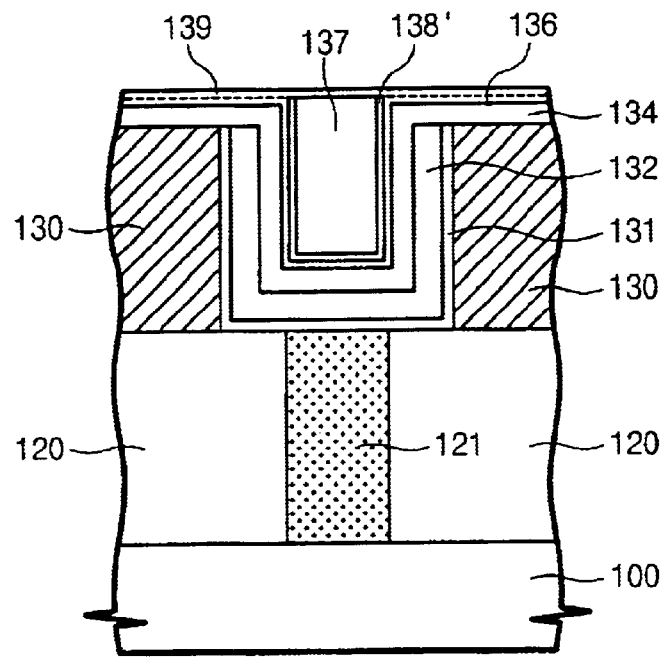

Referring to FIG. 9, a second electrode layer 139 is formed for the top electrode on the substrate over exposed regions of the first layer 136 and the fill material or fill layer 137 are exposed. The second layer 139 for the top electrode may be formed of either the same precious metal as that of the first electrode layer 136 or may be formed of another conductive metal.

Figure 10:
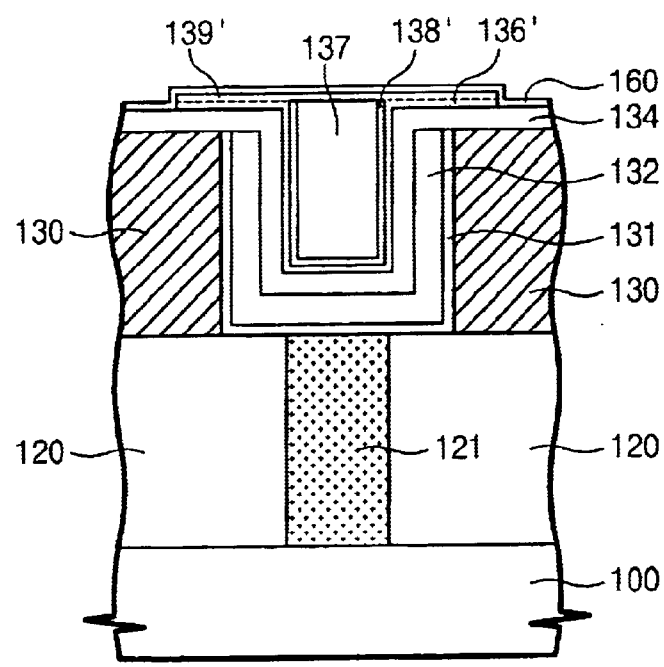

Referring to FIG. 9 and FIG. 10, the first 136 and second layers 139 of the capacitor's top electrode are etched to form the respective portions 136' and 139' (FIG. 10) of the capacitor's top electrode. After such patterning, an upper protection layer 160 is stacked on the entire surface of the thus processed substrate. Upper protection layer 160 may comprise the same kind of the material as that of the previously described protection layer 138 of FIG. 7, e.g., a hydrogen barrier. In one exemplary embodiment, upper protection layer 160 may be formed of silicon oxide.

Figure 11:
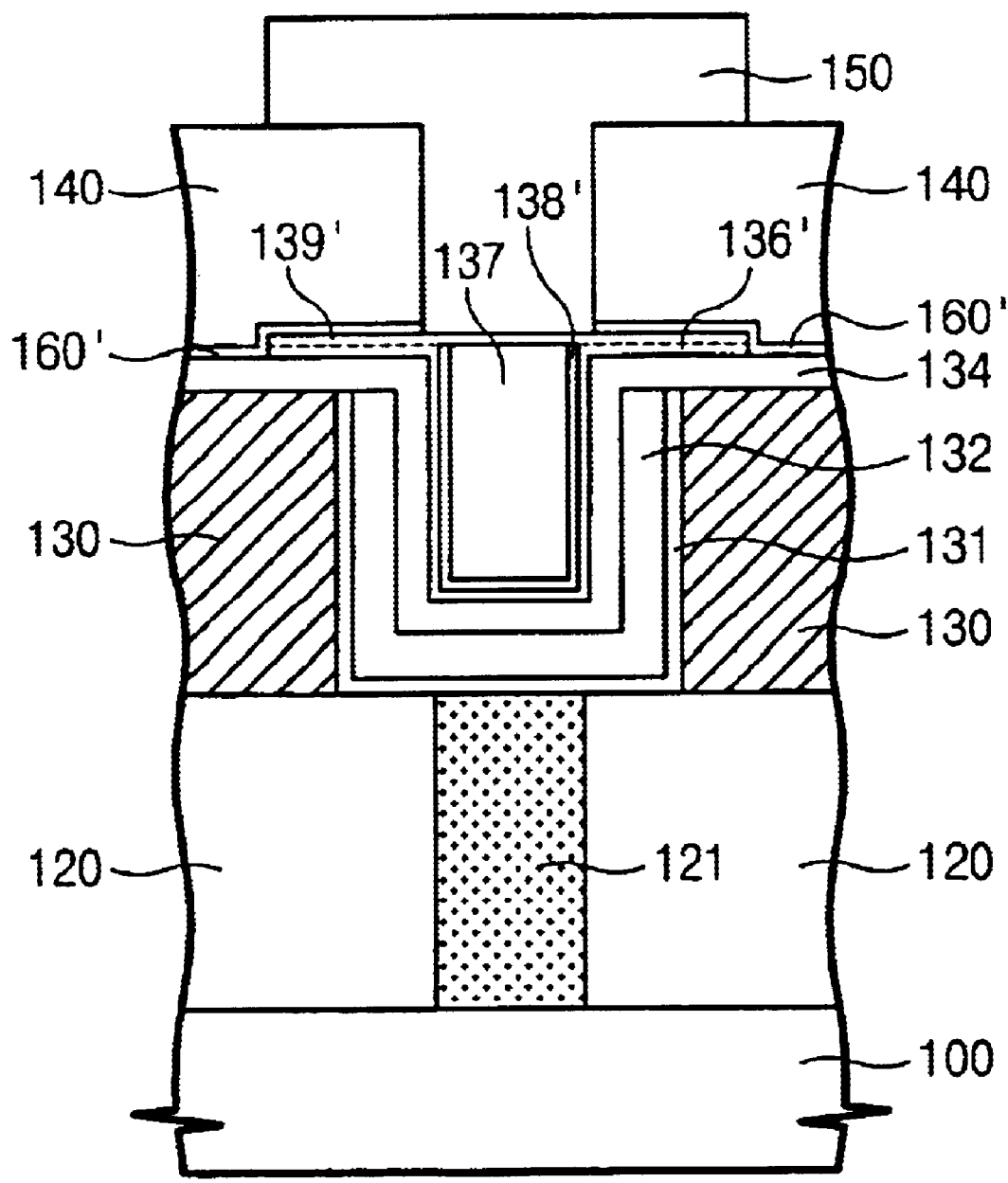

Referring to FIGS. 10 and 11, after forming the capacitor's top electrodes 136' and 139' and upper protection layer 160, another insulation layer 140 is stacked over the protective layer and the top electrode. The second insulation layer 140 is patterned to form a contact hole to expose a region of the capacitor's top electrode e.g., layer 139'. A metal layer such as aluminum is stacked and patterned to form a top electrode contact to the capacitor and a capacitor plate line 150.

Figure 12:
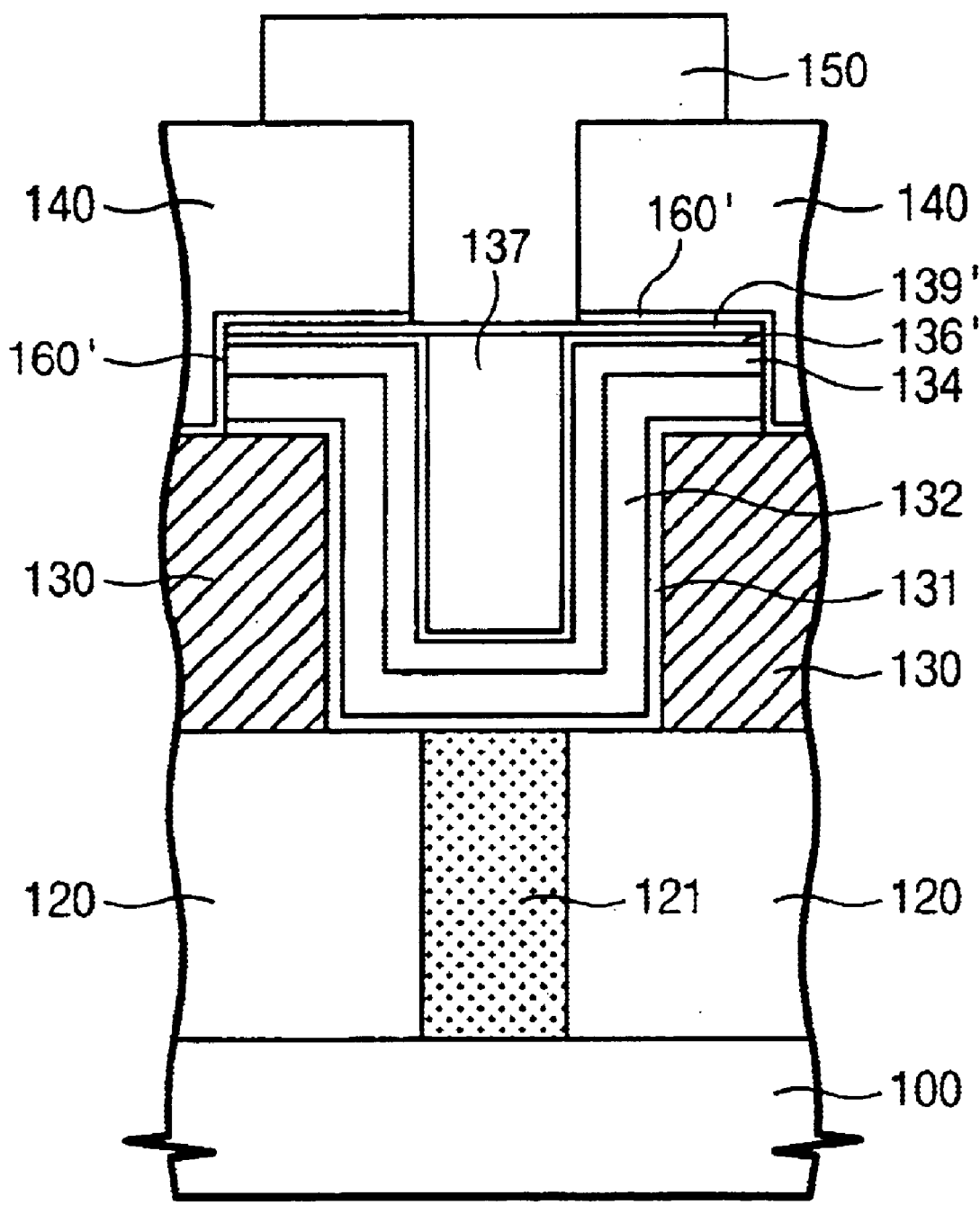
FIG. 12 is a cross-sectional view to illustrate a feature of a FRAM in accordance with other exemplary embodiments of the present invention.

In accordance with another exemplary embodiment of the present invention, referencing FIG. 12, the CMP process that provided for the separation of the capacitor bottom electrode's as described earlier herein relative to FIG. 6 is omitted. In this embodiment, the patterning of the capacitor's top electrodes 136' and 139' may pattern not only the capacitor's first and second top electrode layers, but also the ferroelectric film, the capacitor's bottom electrode layer and the barrier layer. Thus, all of the first and second top electrodes 136' and 139', ferroelectric film 134, the capacitor's bottom electrode 132 and barrier layer 131, of substantially the same pattern, form the capacitor. For the patterning, anisotropic etching may be employed using a plasma of chlorine and oxygen.

Again, after forming the capacitor, a second interlayer insulation layer 140 may be stacked and patterned to form a capacitor contact hole. A metal layer may then be stacked and patterned to form a capacitor contact and a capacitor plate line 150 in electrical communication with the capacitor's top electrode.

According to exemplary embodiment's of the present invention, the bottom electrode for an FRAM capacitor may be formed with a cylinder shape, and the capacitor's top electrode may include a fill material or fill layer that fills a residual cylindrical hollow. In such embodiments, the top surface of the capacitor's top electrode may be formed flat and it may be easy to form a contact for connecting the capacitor's top electrode to a capacitor plate line.

What is claimed is:

1. A ferroelectric random access memory (FRAM) having a cell capacitor comprising:
    a bottom electrode having sidewalls defining a cylinder, and a lower wall meeting the sidewalls and closing an end of the cylinder;
    a ferroelectric film covering a surface of the bottom electrode, the ferroelectric film having:
        a liner part covering an inside surface of the sidewalls and lower wall of the bottom electrode that define the cylinder, and
        a flange part extending radially outward from the cylinder shape and over at least an edge of sidewalls of the bottom electrode;
    a first top electrode layer covering a surface of the ferroelectric film opposite the bottom electrode, a surface of the first top electrode layer that is opposite the ferroelectric film defining a hollow;

a fill material filling the hollow; and a second top electrode layer covering a top surface of the fill material and covering a portion of the first top electrode layer over the flange part of the ferroelectric film.

2. The FRAM of claim 1, in which the first top electrode layer comprises:

an electrode liner part covering the liner part of the ferroelectric film, and an electrode flange part extending radially outward from an upper edge of the electrode liner part, the electrode flange part having a predetermined width over the flange part of the ferroelectric film.

3. The FRAM of claim 1, further comprising a conductive line electrically connecting an upper surface of the second top electrode layer.

4. The FRAM of claim 1, further comprising:

a MOS transistor having a source region; and a contact plug electrically coupling the source region of the MOS transistor to the bottom electrode of the capacitor.

5. The FRAM of claim 4, further comprising a conductive oxidation barrier between the capacitor's bottom electrode and the contact plug.

6. The FRAM of claim 1, wherein the capacitor's bottom electrode further comprises a peripheral part that extends radially outward from the top of the sidewalls and beneath the flange part of the ferroelectric film.

7. The FRAM of claim 6, in which the peripheral part of the bottom electrode extends outwardly to a peripheral edge, the peripheral edge defining a contour substantially aligned with a peripheral edge of the ferroelectric film and that of the first and second top electrodes.

8. The FRAM of claim 1, further comprising:

another one of the capacitor;

the flange part of the ferroelectric film connected with the ferroelectric film of the another one capacitor; and the flange part of the first top electrode layer extending outwardly to a peripheral edge that is aligned with that of the second top electrode layer.

9. The FRAM of claim 1, wherein the bottom electrode comprises material of at least one of the group consisting of platinum, ruthenium, iridium, rhodium, osmium and palladium.

10. The FRAM of claim 1, wherein the ferroelectric material comprises at least one of the group consisting of $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$ and $Bi_4Ti_3O_{12}$.

11. The FRAM of claim 1, wherein the fill material comprises at least one of the group consisting of polysilicon, silicon oxide, SOG and CVD tungsten.

* * * * *